US009570868B2

(12) United States Patent
Kleinke

(10) Patent No.: US 9,570,868 B2
(45) Date of Patent: Feb. 14, 2017

(54) SIGNAL DISTRIBUTOR

(71) Applicant: ESCHA BAUELEMENTE GMBH, Halver (DE)

(72) Inventor: Andreas Kleinke, Kierspe (DE)

(73) Assignee: ESCHA BAUELEMENTE GMBH, Halver (DE)

( * ) Notice: Subject to any disclaimer, the term of this patent is extended or adjusted under 35 U.S.C. 154(b) by 0 days.

(21) Appl. No.: 14/893,842

(22) PCT Filed: May 28, 2014

(86) PCT No.: PCT/EP2014/061004
§ 371 (c)(1),
(2) Date: Nov. 24, 2015

(87) PCT Pub. No.: WO2014/191441
PCT Pub. Date: Dec. 4, 2014

(65) Prior Publication Data

US 2016/0118757 A1 Apr. 28, 2016

(30) Foreign Application Priority Data

May 29, 2013 (DE) ........................ 10 2013 105 518

(51) Int. Cl.
*H05K 1/00* (2006.01)
*H01R 25/00* (2006.01)
(Continued)

(52) U.S. Cl.
CPC .......... *H01R 25/006* (2013.01); *H01R 9/2491* (2013.01); *H01R 13/665* (2013.01);
(Continued)

(58) Field of Classification Search
CPC .......................... H01R 25/006; H01R 13/5202
(Continued)

(56) References Cited

U.S. PATENT DOCUMENTS 4,401,353 A * 8/1983 McDevitt, Jr. ....... H05K 7/1092 439/189
5,233,873 A * 8/1993 Mozgowiec ............ G01P 1/023 73/493
(Continued)

FOREIGN PATENT DOCUMENTS

DE 10256374 B3 * 7/2004 ......... H01R 13/5045
EP 1039589 B1 5/2008

*Primary Examiner* — Tulsidas C Patel
*Assistant Examiner* — Peter G Leigh
(74) *Attorney, Agent, or Firm* — Lucas & Mercanti, LLP; Klaus P. Stoffel

(57) ABSTRACT

A signal distributor for connecting a trunk line to branch lines, includes a plastic housing having a ceiling with passage openings, a printed circuit board with plug sockets for contacting a respective branch line. The plug sockets pass from the rear side of the ceiling through the passage openings during mounting of the circuit board. The outer wall of each plug socket and the outer wall of the passage opening edge are narrowly spaced so that, during casting of a housing cavity that receives the circuit board with a potting compound after installing the circuit board, no potting compound passes through the passage opening. The ceiling and the printed circuit board are made of a first plastic, which has low elongation at break, and the edge of the passage opening is made of a second plastic having an elasticity greater than the elongation at break of the first plastic.

17 Claims, 10 Drawing Sheets

(51) Int. Cl.
*H01R 9/24* (2006.01)
*H01R 13/717* (2006.01)
*H01R 13/74* (2006.01)
*H01R 13/66* (2006.01)

(52) U.S. Cl.
CPC ......... *H01R 13/7175* (2013.01); *H01R 13/74* (2013.01); *H01R 25/00* (2013.01); *H01R 13/6658* (2013.01)

(58) Field of Classification Search
USPC ............................................. 439/620.21, 278
See application file for complete search history.

(56) References Cited

U.S. PATENT DOCUMENTS

| | | | | |
|---|---|---|---|---|
| 5,343,748 | A * | 9/1994 | Mozgowiec | G01P 1/023 73/497 |
| 7,390,210 | B2 * | 6/2008 | Corona | B29C 45/14065 439/281 |
| 8,172,583 | B2 * | 5/2012 | Friedrich | H01R 9/2466 439/680 |
| 8,480,422 | B2 * | 7/2013 | Siahaan | H01R 13/504 439/278 |
| 8,536,746 | B2 * | 9/2013 | Kuhnen | H02K 5/148 310/239 |
| 8,957,559 | B2 * | 2/2015 | Schneider | H02K 5/16 310/43 |
| 2005/0106949 | A1 * | 5/2005 | Lappohn | H01R 13/111 439/748 |
| 2008/0045065 | A1 * | 2/2008 | O'Connor | H01R 4/029 439/271 |

* cited by examiner

SIGNAL DISTRIBUTOR

The present application is a 371 of International application PCT/EP2014/061004, filed May 28, 2014, which claims priority of DE 10 2013 105 518.4, filed May 29, 2013, the priority of these applications is hereby claimed and these applications are incorporated herein by reference.

BACKGROUND OF THE INVENTION

The invention relates to a signal distributor for connecting a signal trunk line to a plurality of signal branch lines, comprising a housing, which is made of plastic and which has a housing ceiling comprising a plurality of regularly arranged passage openings, comprising a printed circuit board, which supports a plurality of plug sockets for contacting a respective signal branch line, wherein the plug sockets pass from the rear side of the housing ceiling through the respective passage openings associated therewith during mounting of the printed circuit board, wherein the outer wall of each plug socket and of the edge of the passage opening associated therewith are narrowly spaced apart from one another such that, during casting of a housing cavity, which receives the printed circuit board, with a potting compound after installing the printed circuit board, no potting compound passes through the passage opening.

A signal distributor of the afore-described type is described in EP 1 039 589 B1. The known signal distributor has a housing, which is made of a hard plastic. The housing has the task of connecting a signal trunk line to a plurality of signal branch lines. For this purpose, the signal trunk line can be connected via a plug contact strip to conductor paths on a printed circuit board consisting of hard plastic. The printed circuit board supports a plurality of regularly arranged plug sockets. The housing has a number of passage openings, which corresponds to the number of plug sockets and through which the plug socket can pass when the fully equipped printed circuit board is inserted into a housing cavity. The printed circuit board is thereby inserted into the housing cavity until the plug sockets have passed through the passage openings to the corresponding measure. In this end position, the printed circuit board can lock in place. After that, the housing cavity is cast with a plastic potting compound, which hardens. The gap between the inner edge of the passage opening and the outer edge of the plug socket needs to be minimal, because potting compound can otherwise pass through the gap in response to the casting. Due to the fact that the printed circuit boards and the housing are produced at different production sites, a high tolerance needs to be maintained in response to the production. This increases the price of production or leads to tensions on the printed circuit board, which have the result that electric contacts to the electronic components, which are supported on the printed circuit board, are impacted, respectively, if the tolerances are not maintained.

SUMMARY OF THE INVENTION

The invention is based on the object of improving the production of the known signal distributor.

Initially and substantially it is proposed for the housing ceiling or the housing, which includes the housing ceiling, respectively, and the printed circuit board to be made of a hard plastic. The elongation at break of this plastic is preferably maximally five percent. The plastic can thus also be glass fiber reinforced. The opening has an edge, which is made of a soft plastic, the elasticity of which is preferably at least one hundred percent. As a result, the opening can even be made smaller than specified. The production tolerances can be significantly greater than they need to be estimated in the prior art. The edge of the opening can yield elastically in radial direction. It is sufficient thereby, if the soft plastic component has a radial extension of a few millimeters, in particular between 1 mm and 2 mm. In a preferred embodiment of the invention, the edges of the opening are formed by an annular lining, which is injection molded to the housing ceiling. This preferably takes place in a two-component injection molding process. The Shore hardness of the soft plastic component can be in the range of between 50 A and 70 D.

The individual annular linings can be connected to one another by means of webs. The annular linings are preferably mounted to or in the opening, respectively, with a positive fit. For this purpose, the opening of the hard plastic component can embody an annular web, around which the material of the injected soft plastic component wraps. The plastic components furthermore preferably consist of such a material that the surfaces of hard plastic component and soft plastic component connect to one another in an adhesive manner in the area of their bounding surfaces. The soft plastic component can furthermore have a light guiding component. The soft plastic component can furthermore have light guiding sections, which are adjoined by light emitting diodes, which are supported by the printed circuit board so as to be in contact therewith. These light guiding sections are also connected to the annular linings, in particular via webs, so that the annular linings can send light, which is emitted by the light emitting diodes and which is coupled into the light guiding sections. The light emitting diodes are components, which are attached to the top side of the printed circuit board. They are powered by means of conductor paths, which are applied to the printed circuit board. Provision is preferably made for means, by means of which the printed circuit board is fixed to the housing ceiling by means of a force fit. For this purpose, the outer wall of the plug socket can embody a locking step. This locking step overlaps a step of the annular lining. The step of the annular lining can be the edge of the annular lining, which faces the front side of the housing ceiling. The locking step of the plug socket can be formed by an annular collar or an annular groove of the outer wall of the plug socket. The outer wall of the plug socket can in particular be embodied by a sleeve part, which is made of metal. This sleeve part is inserted into a core part of the plug socket, which consists of plastic. Contact pins made of metal, which have fastening feet, are located inside the core part of the plug socket. These fastening feet serve to fasten the plug socket to the printed circuit board by means of soldering. For this purpose, the printed circuit board has openings, through which the solder fastening pins project. The core part of the plug socket can furthermore embody support projections, which are supported on the printed circuit board. The passage openings or the plug sockets, respectively, have a regular arrangement. They can be arranged on the top side of the housing ceiling in rows or in columns, respectively. An arrangement, in the case of which the centers of the passage openings are located on the corner points of a rectangle, are preferred. The totality of the passage openings or plug sockets, respectively, is then located on the corner points of straight lines, which intersect one another at right angles and which are evenly spaced apart from one another, resulting in a plurality of adjacent rectangles having the same design, on the corner points of which an opening or a plug socket, respectively, is located in each case. As a result of tolerances, the length of the sides of the rectangle differ from one another. Fastening sleeves, which, in the installed state, reach through openings of the printed circuit board, can also be made of the soft plastic component. The branch lines have mating plugs, which correspond to the plug sockets and which are attached or screwed to the plug sockets, respectively, so that the leads of a cable, which forms the signal branch line, come into electric conductive connection with the electric contacts. The signal trunk line can be connected to the conductor paths of the printed circuit board via a plug contact. However, provision is also made for the signal trunk line to be embodied by a cable, which is inserted into an opening of the housing, but which is in particular also injected. The plug sockets preferably have a circular cross section. The outer diameter of the plug socket is greater than the inner diameter of the annular lining. The annular lining is thus stretched slightly when the plug socket is pushed through it. The annular lining can thereby deform to varying extents at different circumferential points, so that the annular lining does not only have a tolerance-compensating effect, but also a sealing effect. The annular lining, which has a thickness of between 1 mm and 2 mm, can absorb comparatively high tolerances. It prevents that a potting compound, which is in particular transparent, which is injected into the housing cavity after inserting the printed circuit board, passes past the outer plug socket wall to the front side of the housing ceiling.

Exemplary embodiments of the invention will be specified below by means of enclosed drawings.

DETAILED DESCRIPTION OF THE INVENTION

Figure 1:
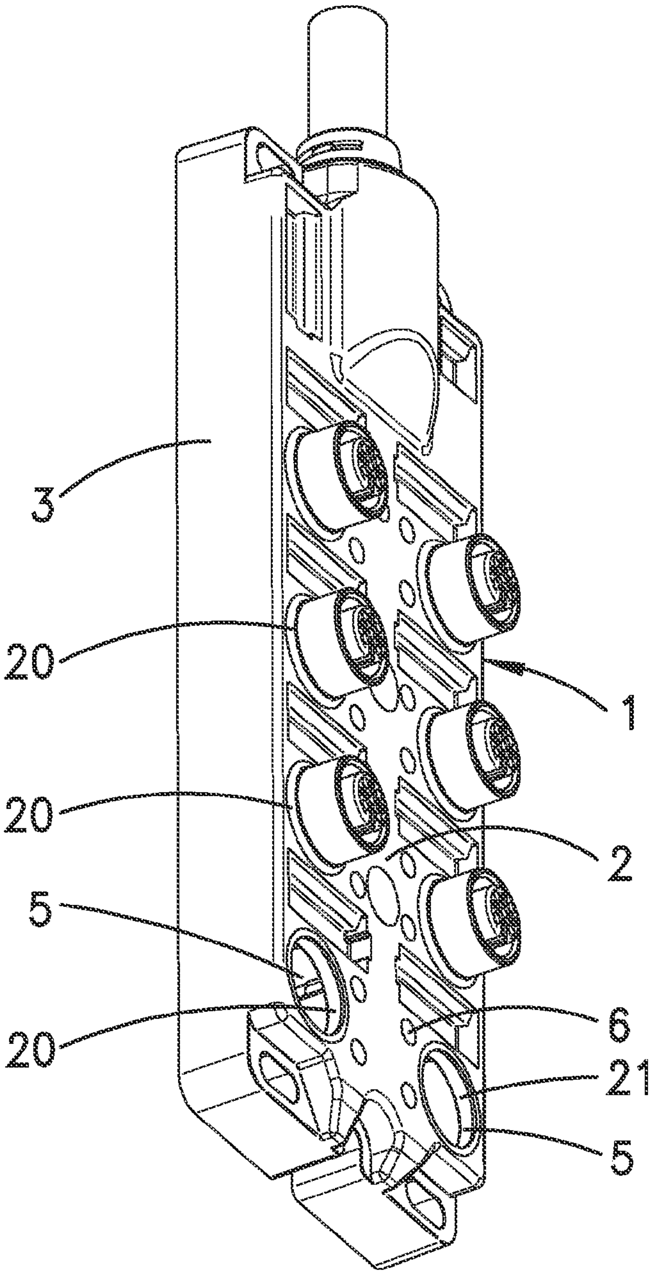
FIG. 1 shows a perspective illustration of a signal distributor according to the invention, in the case of which no plug sockets 11 are illustrated in two passage openings 5 of a housing ceiling 2, only for clarification purposes.

The drawings illustrate a housing 1, which consists of a glass fiber reinforced hard plastic. The housing 1 embodies a housing ceiling 2 and housing walls 3. The rear side of the housing ceiling 2 and the housing walls 3 surround a housing cavity 4. The housing ceiling 2 has a total of eight regularly arranged passage openings 5, which has a circular cross section. In addition, the housing ceiling 2 also has a plurality of openings 6, which serve to display light. The cable of a signal trunk line is injected into an opening 7. The material of the housing 1 is a brittle, in particular also fiber glass reinforced plastic, which has a small elongation at break. The elongation at break is less than 5 percent. If the material is elongated by more than 5 percent, it breaks.

The edge of the passage opening 5, which is formed by the hard plastic housing ceiling 2, has an annular web 8, which is oriented radially inwards. The side wall of the annular web 8, which faces the front side of the housing ceiling 2, is narrowly spaced apart from the front side of the housing ceiling 2.

The drawings further show a printed circuit board 10, which also consists of a fiber glass reinforced hard plastic. This printed circuit board has non-illustrated conductor paths and electronic components, which are connected to the conductor paths by means of a surface contact. In particular, the printed circuit board 10 supports one or a plurality of light emitting diodes 17. At eight points, which correspond to the locations of the passage opening 5, the printed circuit board furthermore has fastening openings 15, which engage with the solder fastening pins 14 of contact pins 13 and which are soldered thereto. The printed circuit board 10 is made of an in particular fiber glass reinforce plastic, which has a high brittleness or hardness, respectively, just as the plastic of the housing 1, and which has an elongation at break, which is less than 5 percent.

The contact pins 13 are inserted into contact openings of a core part 25, which is made of plastic, of a plug socket 11. Provision is made for a total of eight plug sockets 11.

The core parts 25 are surrounded by metal sleeves 12. The metal sleeves 12 are fixedly connected to the core part 25, in particular with a positive fit. The sleeve parts 12 have a circular cross section and in each case support an annular collar 16, which projects radially outwards, on their outer wall.

The core part 25 embodies feet 18, by means of which the core part 25 is supported on the top side of the printed circuit board 10.

The drawings furthermore show a soft plastic component 20, which is injection molded to the housing 1 or the housing ceiling 2, respectively. This takes place in a two-component injection molding process. The soft plastic component 20 can have light guiding component. It can be transparent. If the soft plastic component 20 is transparent, light, which a light emitting diode 17 couples into a light guiding section 23, can be guided into the entire soft plastic component 20. As compared to the hard plastic component, of which the housing 1 or the printed circuit board 10 is made, respectively, the soft plastic component has a significantly higher elongation at break. It is an elastic plastic. In the case of the exemplary embodiment, the elongation at break, thus the elongation, up to which the plastic can be deformed, is at least 100 percent.

Figure 2:
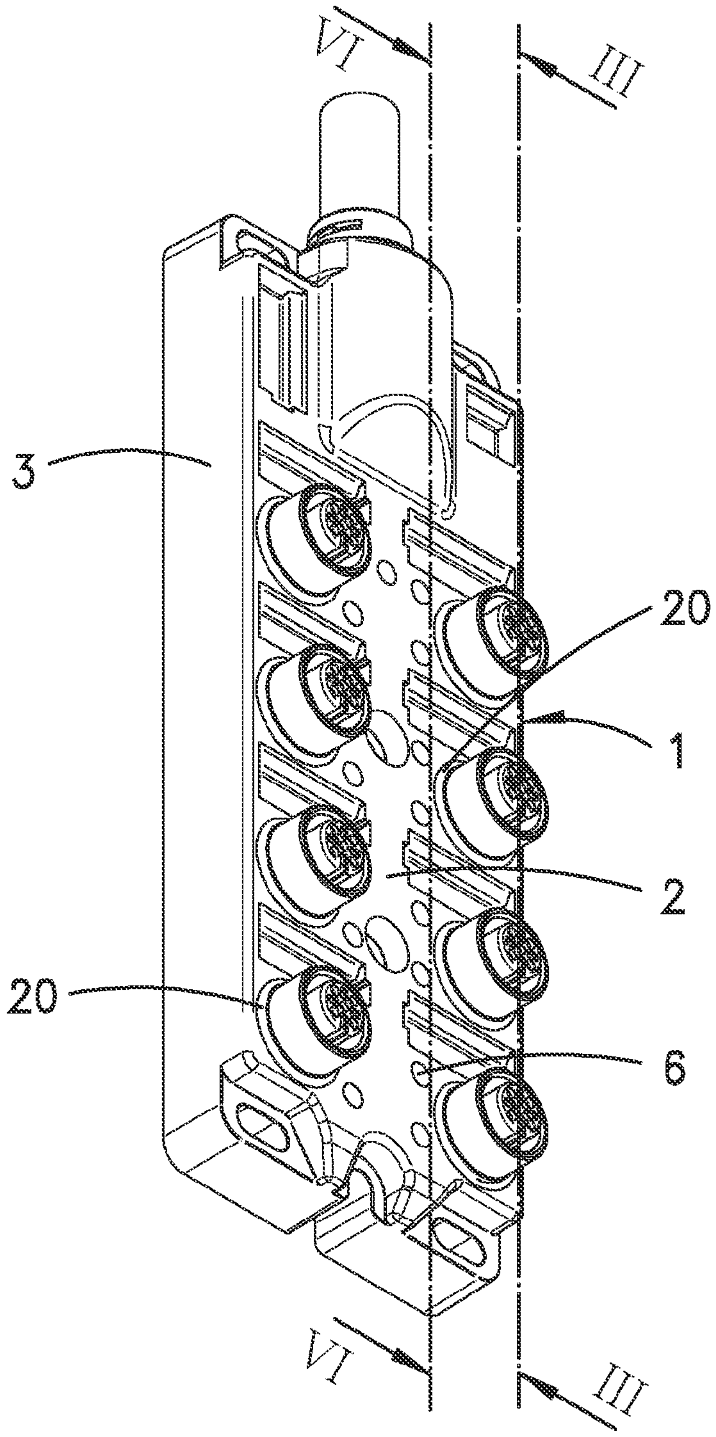
FIG. 2 shows an illustration according to FIG. 1, but completely.
Figure 3:
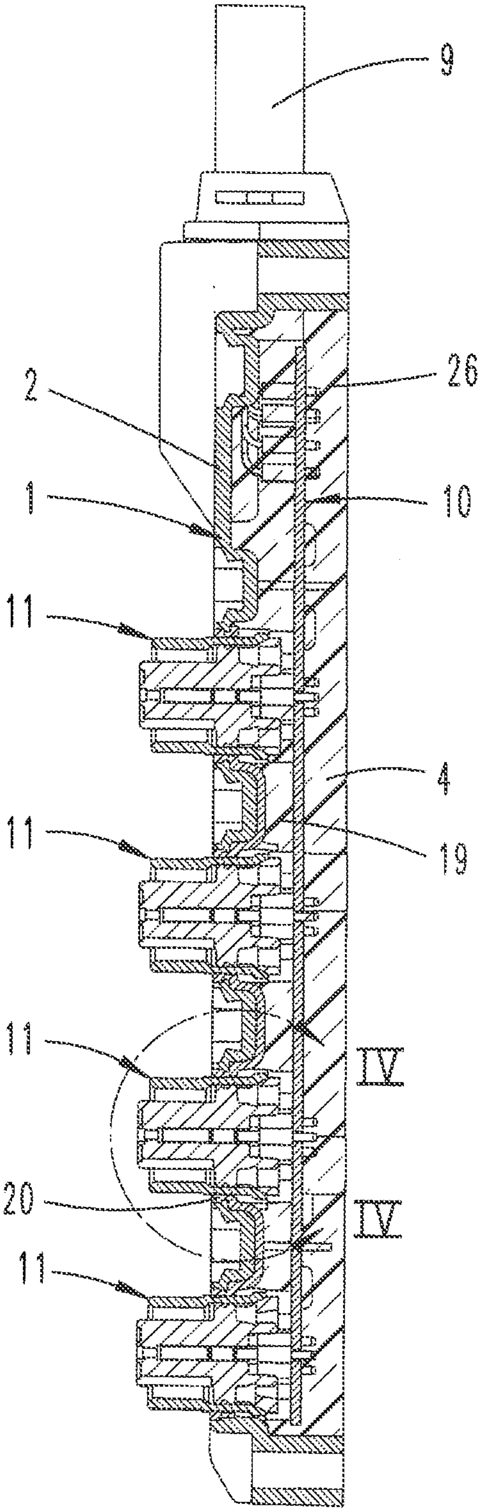
FIG. 3 shows a section according to line III-III in FIG. 2.
Figure 4:
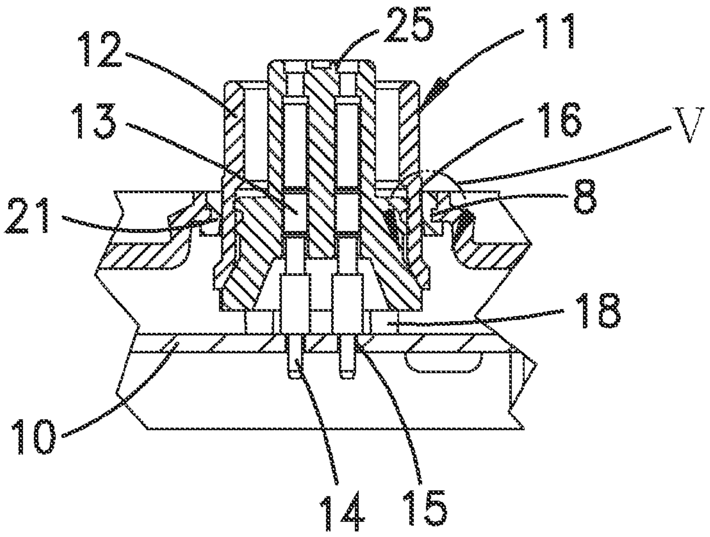
FIG. 4 shows the enlarged section IV-IV in FIG. 3.

Annular linings 21, which reduce the effective inner diameter of the passage openings 5 to such a measure that it is slightly smaller than the outer diameter of the sleeve part 12, are embodied with the soft plastic component. As a result of the elastic characteristic of the soft plastic component, the annular linings 21 can deform. The wall thickness of the annular lining can thus be reduced area by area by up to 50 percent. FIG. 1 shows a signal distributor, in the case of which only six of the total of eight passage openings 5 of the housing ceiling 2 are equipped with plug sockets 11. No plug sockets 11 are illustrated in the two passage openings 5, which are illustrated on the bottom, for being able to recognize the annular lining 21. The signal distributor is illustrated completely in FIG. 2. The sectional illustration according to FIG. 3 shows the printed circuit board 10, which is located in the housing cavity 4. A space 19, which is cast with a potting compound 26, is located between the rear side of the housing ceiling 2 and the surface of the printed circuit board 11, which faces the housing ceiling 2. The potting compound 26 also extends across the rear side of the printed circuit board, so that the printed circuit board 10 is cast in completely.

Figure 5:
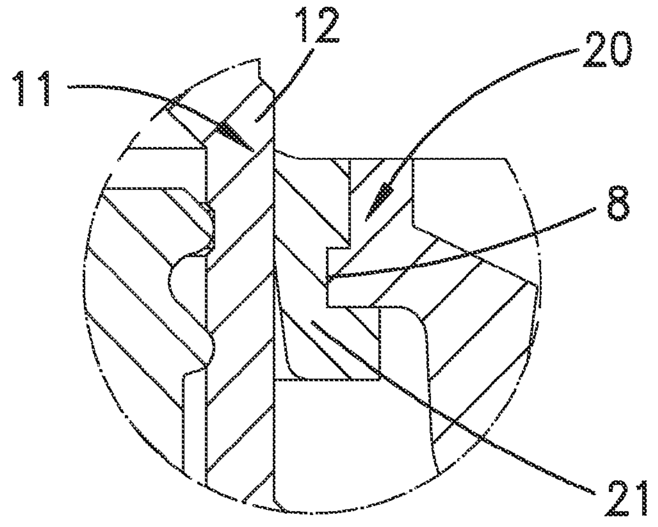
FIG. 5 shows the enlarged section V-V in FIG. 4.

It can be gathered from FIG. 5 that the annular lining 21, which is embodied by the soft plastic component 20, is slightly deformed in radial direction. The inner wall of the annular lining 21 rests against the outer jacket wall of the sleeve part 12 at a certain tension.

Figure 11:
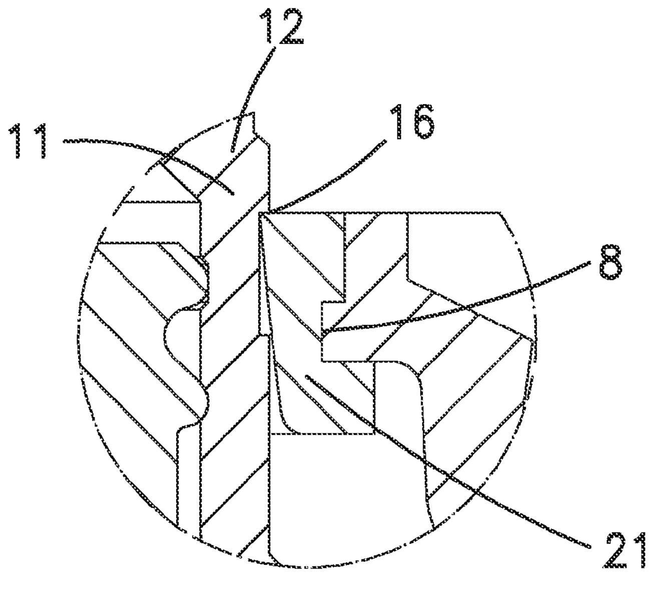
FIG. 11 shows an illustration according to FIG. 5, but with a step 16.

FIG. 11 shows a modification. Here, the outer jacket wall of the sleeve part 12 of the plug socket 11 embodies an annular groove. An outer edge of the annular groove embodies a locking step 16, against which the outer edge of the annular lining 21, which faces the outer housing side, rests.

Figure 8:
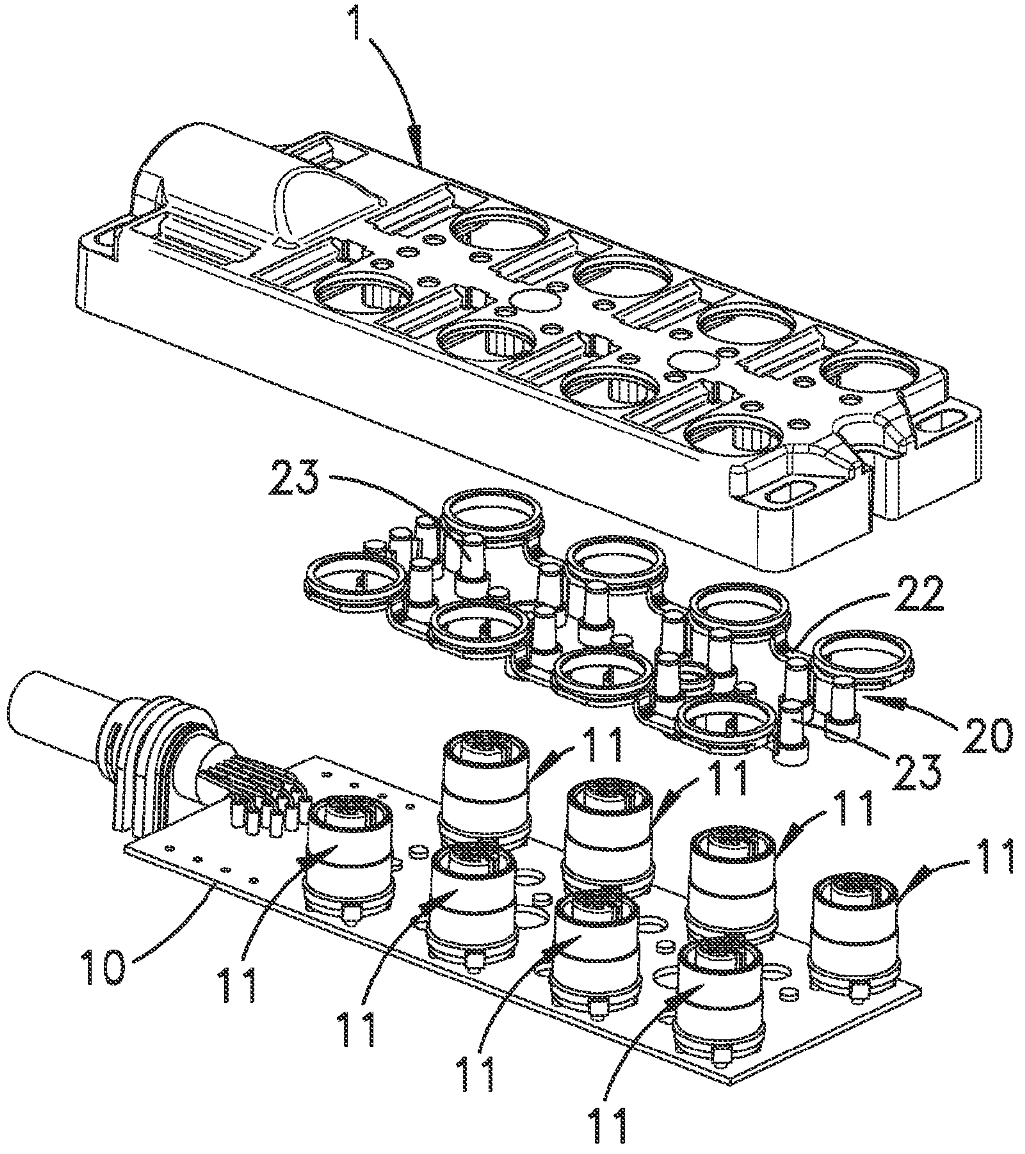
FIG. 8 shows an exploded illustration for clarifying the embodiment of the different components of the signal distributor.
Figure 10:
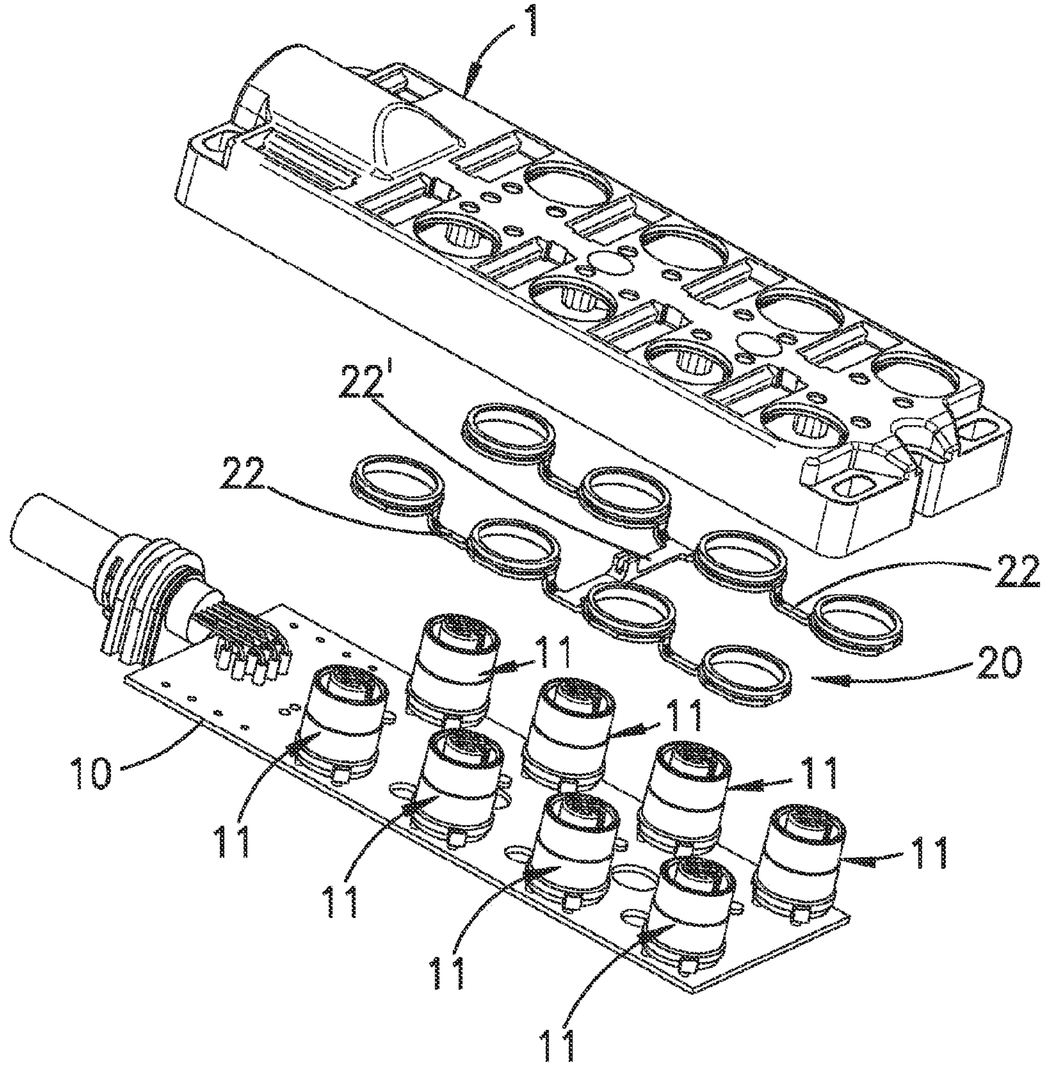
FIG. 10 shows an exploded illustration according to FIG. 8, but with the soft plastic component illustrated in FIG. 9.

The individual annular linings 21 are connected to one another via webs 22, 22'. In particular FIGS. 8 and 10 show the type of the connection of the annular linings. In addition, the soft plastic component 20 also embodies the above-mentioned light guiding sections 23, which have sections, which can project through openings 6 of the housing ceiling 2. The soft plastic component 20 furthermore also embodies one or a plurality of fastening sleeves 24, which project away from the rear side of the housing ceiling 2 and which reach through openings of the printed circuit board 10.

As a result of tolerances, the centers of the annular webs 8, thus of the passage opening 5 embodied by the housing ceiling 2 and the centers of the plug sockets 11, which are attached to the printed circuit board 10 and which are fixedly connected to the printed circuit board, do not correspond to one another. The annular linings 21 deform, if the printed circuit board 10, which is equipped with the plug sockets 11, is inserted into the housing cavity 4, so that the plug sockets 11, which project away from the printed circuit board 10, project through the passage openings 5. A sealing contact of the annular lining 21 which is made smaller than specified, to the sleeve part 12 thus remains. The printed circuit board 10 is pushed into the opening until the printed circuit board 10 or a light emitting diode 17, which sits on the printed circuit board 10, respectively, hits against the bottom side 23' of a light guiding section 23. As a result of the elasticity of the light guiding section 23, the printed circuit board 10 can be displaced slightly farther towards the rear side of the housing ceiling 2, wherein the light guiding section 23 then deforms slightly, so that a secure surface contact of the bottom side 23' against the top side of the light emitting diode 17 is ensured.

If the outer wall of the sleeve part 12 has the step 16 as illustrated in FIG. 11, the edge section of the annular lining 21, which faces the front side of the housing ceiling 2, can support itself thereon. A locking then takes place in response to the insertion of the plug socket 11 in the passage opening 5.

Figure 6:
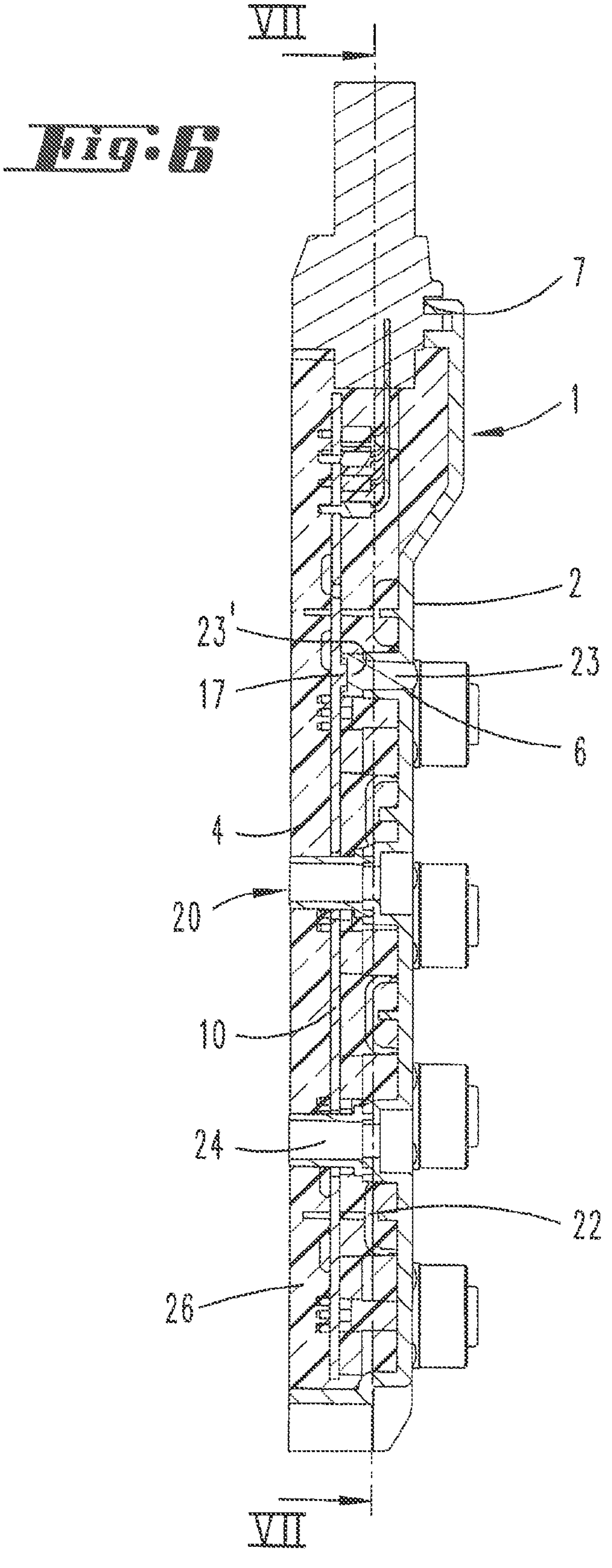
FIG. 6 shows the section according to line VI-VI in FIG. 2.

The soft plastic component can consist of an opaque material. However, it can also consist of a translucent material. In the latter case, the light emitted by the light emitting diode 17 can be guided to the outside via the light guiding section 23. However, the light emitted by the light emitting diode 17 can also be guided to the annular linings 21, in particular via the webs 22, 22', so that the annular linings 21 can send light. FIG. 6 shows that the soft plastic component 20 forms a conical body, which embodies a light guiding section 23. The light guiding section 23 has a flat bottom, which rests flat against the light emitting surface of the light emitting diode 17. The light guiding section 23 projects through an opening 6 of the housing ceiling 2, so that the light sent by the light emitting diode 17 can pass through the light guiding section 23.

The materials of the hard plastic component, from which the housing 1 is injection molded, and of the soft plastic component 20 are chosen in such a manner that they adhere to one another in the area of their adjacent bounding surfaces, in response to the two-component injection molding. However, provision is additionally made for positive fit holding means for holding in particular the annular linings 21 in the passage openings 5 of the housing ceiling 2 associated therewith. The above-mentioned annular web 8, the shoulders of which, which are oriented to the bottom and to the top, is insert molded completely by the soft plastic component 20, so that the annular web 8 engages with a circumferential groove of the annular lining 21, which has a U-shaped cross section.

Figure 7:
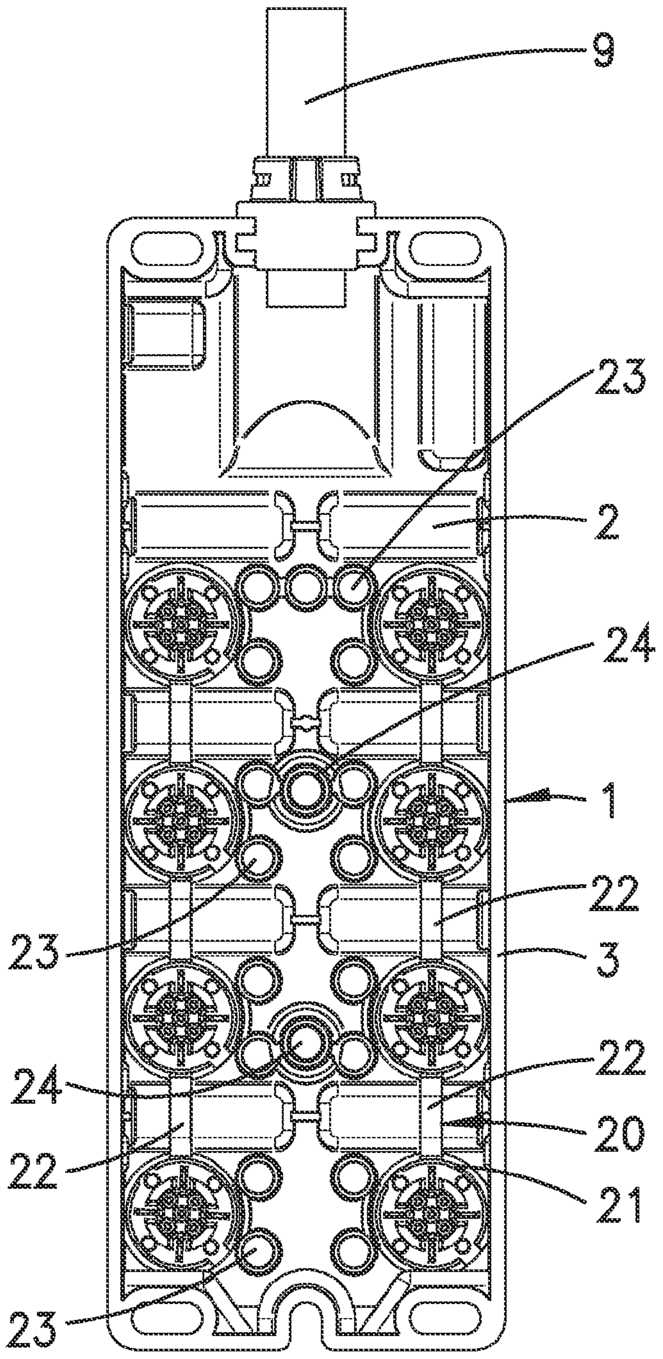
FIG. 7 shows a section approximately according to line VII-VII in FIG. 6.

FIGS. 7 and 8 show a first alternative of the soft plastic component 22. The soft plastic component 22 forms eight annular linings 21, which are connected to one another view webs 22. A plurality of conical bodies, which in each case embody a light guiding section 23, are located between the two rows of the annular linings 21.

Fastening sleeves 24, which are embodied by the soft plastic component 20 and which project through the printed circuit board 10 through corresponding openings, can be located between the individual light guiding sections 23.

Figure 9:
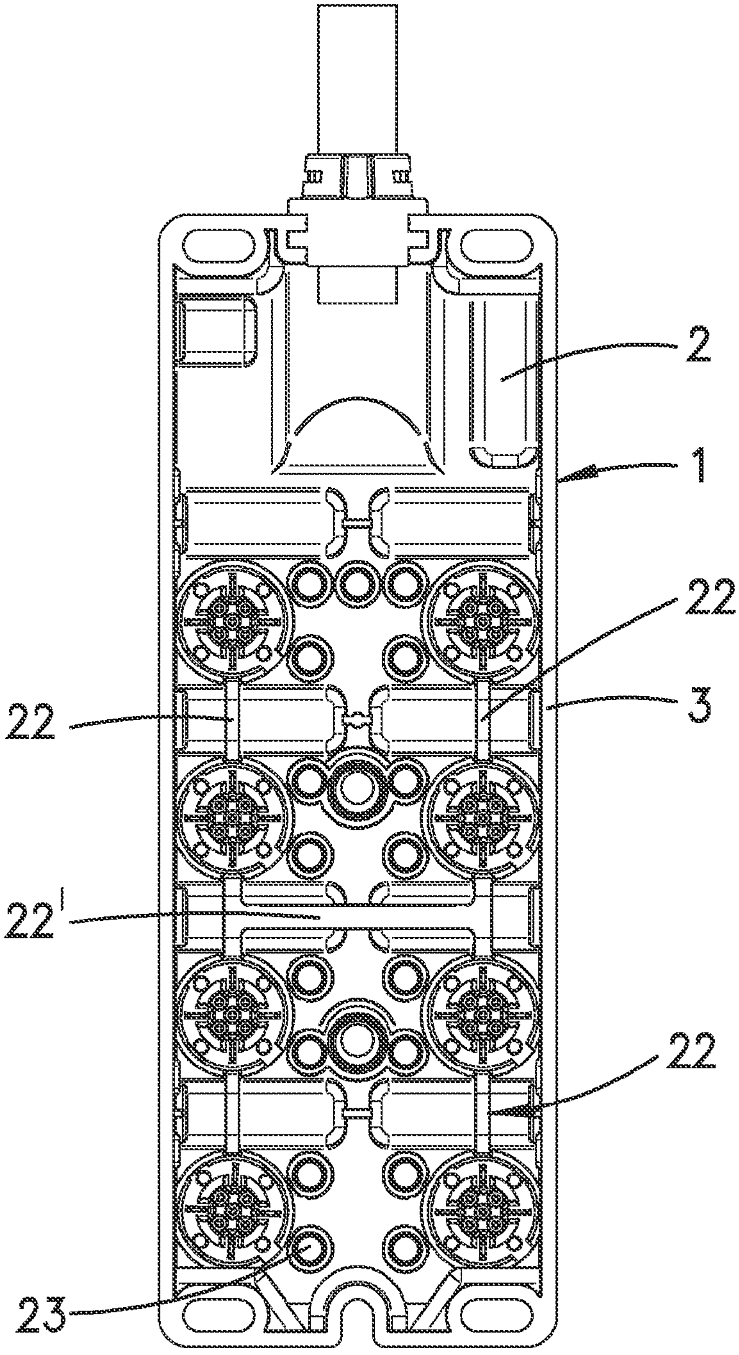
FIG. 9 shows an illustration according to FIG. 7, but with a modified soft plastic component 20.

In the case of the exemplary embodiment illustrated in FIGS. 9 and 10, the individual annular linings 21 are connected to one another only by means of webs 22. The light guiding sections 23 or fastening sleeves 24, respectively, can be made of other materials. In particular a light guiding plastic component, which does not include any soft plastic components, can be used.

The webs 22, 22' substantially serve the purpose of ensuring the material flow from the injection pumps to the individual sections of the mold cavity in response to the two-component injection molding.

The explanations above serve to specify the inventions, which are captured by the application as a whole and which further develop the prior art independently in each case, at least by the following feature combinations, namely:

A signal distributor, which is characterized in that the housing ceiling 2 and the printed circuit board 10 are made of a first plastic, which has a smaller elongation at break, in particular of maximally five percent, and the edge of the passage opening 5 is made of a second plastic, the elongation at break of which is higher than the elongation at break of the first plastic and which is in particular at least one hundred percent.

A signal distributor, which is characterized in that the edges of the passage openings 5 are formed by an annular lining 21 of a soft plastic component 20, which is injection molded to the housing ceiling 2.

A signal distributor, which is characterized in that the Shore hardness of the soft plastic component 20 lies in the range of between 50 A and 70 D.

A signal distributor, which is characterized in that the soft plastic component 20 has light guiding components and is in particular transparent.

A signal distributor, which is characterized in that the inside dimension of the annular lining 21 is smaller than the outer dimension of the plug socket 11 and that in particular the inner diameter of the circular annular lining 21 is smaller than the outer diameter of the circular plug socket 11.

A signal distributor, which is characterized in that the printed circuit board 10 is fixed to the housing ceiling 2 in a force fit, for the purpose of which in particular a locking step 16 of the plug socket 11 reaches over a step of the annular lining 21, wherein provision is made in particular for the locking step 16 to be embodied by a circumferential collar or by a circumferential groove of a sleeve part 12, which is formed by the plug socket 11.

A signal distributor, which is characterized in that the printed circuit board 10 supports electronic components 17, which are in particular connected to conductor paths of the printed circuit board 10 by means of a surface contact.

A signal distributor, which is characterized in that the electronic component comprise at least one light emitting diode 17, which adjoin a bottom side 23' of a light guiding section 23 of the soft plastic component 20 so as to be in contact therewith, when the printed circuit board (10) is inserted into the housing cavity (4).

A signal distributor, which is characterized in that the light emitting diode 17 is connected to at least one annular lining 21 via the soft plastic component 20 and in particular via webs 22, 22', so that the annular lining 21 sends light emitted by the light emitting diode 17.

A signal distributor, which is characterized in that the plug socket 11 has solder fastening feet 14, by means of which the plug socket 11 is fastened in openings 15 of the printed circuit board 10.

A signal distributor, which is characterized in that the plug socket 11 has support projections 18, by means of which it is supported on the top side of the printed circuit board 10.

A signal distributor, which is characterized in that, in the area of a section, which faces the housing cavity 4, the housing ceiling 2, which consists of hard plastic, embodies an annular web 8, around which the outer wall of the annular lining 21 is injection molded in such a manner that the annular lining 21 is tied in the opening of the housing ceiling 2 with a positive fit.

All of the disclosed features (alone, but also in combination with one another) are essential for the invention. The disclosure content of the corresponding/enclosed priority documents (copy of the earlier application) is hereby also included in its entirety in the disclosure of the application, also for the purpose of adding features of these documents to claims of the instant application. The features of the subclaims characterize independent inventive further developments of the prior art, in particular for filing divisional applications on the basis of these claims.

LIST OF REFERENCE/NUMERALS

1 housing
2 housing ceiling
3 housing wall
4 housing cavity
5 passage opening
6 opening light display
7 opening
8 annular web
9 signal trunk line
10 printed circuit board
11 plug socket
12 sleeve part
13 contact pin
14 solder fastening
15 fastening opening
16 step
17 LED
18 support projection
19 space
20 soft plastic component
21 annular lining
21' inner wall
22 web
22' web
23 light guiding section
23' bottom side
24 fastening sleeve
25 core part

The invention claimed is:

1. A signal distributor for connecting a signal trunk line to a plurality of signal branch lines, comprising:

a plastic housing, which has a housing ceiling comprising a plurality of regularly arranged passage openings; a printed circuit board that supports a plurality of plug sockets for contacting a respective signal branch line, wherein the plug sockets pass from a rear side of the housing ceiling through the respective passage openings associated therewith during mounting of the printed circuit board, wherein an outer wall of each plug socket and an outer wall of an edge of the passage opening associated therewith are narrowly spaced apart from one another so that, during molding of a housing cavity, which receives the printed circuit board, and filling with a potting compound after installing the printed circuit board, no potting compound passes through the passage opening, wherein the housing ceiling and the printed circuit board are made of a first plastic, which has a smaller elongation at break, and the edge of the passage opening is made of a second plastic having an elongation at break that is higher than the elongation at break of the first plastic.

2. The signal distributor according to claim 1, wherein the elongation at break of the first plastic is at most five percent.

3. The signal distributor according to claim 1, wherein the elongation at break of the second plastic is at least one hundred percent.

4. The signal distributor according to claim 1, wherein the outer wall of the edges of the passage openings are in each case formed by an annular lining of a soft plastic component that is injection molded to the housing ceiling.

5. The signal distributor according to claim 4, wherein the soft plastic component has a Shore hardness in a range of between 50 A and 70 D.

6. The signal distributor according to claim 4, wherein the soft plastic component has light guiding components and is transparent.

7. The signal distributor according to claim 4, wherein an inside dimension of the annular lining is smaller than an outer dimension of the plug socket.

8. The signal distributor according to claim 7, wherein an inner diameter of the circular annular lining is smaller than an outer diameter of the circular plug socket.

9. The signal distributor according to claim 4, wherein the printed circuit board supports electronic components, which are connected to conductor paths of the printed circuit board by a surface contact.

10. The signal distributor according to claim 9, wherein the electronic components comprise at least one light emitting diode that adjoins a bottom side of a light guiding section of the soft plastic component so as to be in contact therewith when the printed circuit board is inserted into the housing cavity.

11. The signal distributor according to claim 10, wherein the light emitting diode is connected to at least one annular lining via the soft plastic component so that the annular lining conducts light emitted by the light emitting diode.

12. The signal distributor according to claim 4, wherein, in an area of a section that faces the housing cavity, the housing ceiling, which consists of hard plastic, embodies an annular web, around which an outer wall of the annular lining is injection molded so that the annular lining is tied in the opening of the housing ceiling with a positive fit.

13. The signal distributor according to claim 1, wherein the printed circuit board is fixed to the housing ceiling in a force fit.

14. The signal distributor according to claim 13, wherein a locking step of the plug socket reaches over a step of the annular lining.

15. The signal distributor according to claim 14, wherein the locking step is a circumferential collar or a circumferential groove of a sleeve part that is formed by the plug socket.

16. The signal distributor according to claim 1, wherein the plug socket has solder fastening feet by which the plug socket is fastened in openings of the printed circuit board.

17. The signal distributor according to claim 1, wherein the plug socket has support projections by which the plug socket is supported on a top side of the printed circuit board.

* * * * *